United States Patent
Tsai

(10) Patent No.: US 11,084,981 B2
(45) Date of Patent: Aug. 10, 2021

(54) SILICON ETCHANT WITH HIGH SI/SIO2 ETCHING SELECTIVITY AND APPLICATION THEREOF

(71) Applicant: CJ Technology Co., Ltd., Taipei (TW)

(72) Inventor: Mo Hsun Tsai, Taoyuan (TW)

(73) Assignee: CJ TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 16/743,291

(22) Filed: Jan. 15, 2020

(65) Prior Publication Data

US 2020/0248074 A1 Aug. 6, 2020

(30) Foreign Application Priority Data

Feb. 1, 2019 (TW) .................. 108104163

(51) Int. Cl.
*C09K 13/00* (2006.01)
*H01L 21/306* (2006.01)

(52) U.S. Cl.
CPC ........ *C09K 13/00* (2013.01); *H01L 21/30604* (2013.01)

(58) Field of Classification Search
CPC ... C09K 13/00; C09K 13/06; H01L 21/30604; H01L 21/32134
See application file for complete search history.

(56) References Cited

U.S. PATENT DOCUMENTS

2008/0096785 A1* 4/2008 Egbe ...................... C11D 7/261
510/176
2019/0078037 A1* 3/2019 Grigoletto .............. C09D 9/005

FOREIGN PATENT DOCUMENTS

WO WO-2017064527 A1 * 4/2017 ............... C11D 3/43

OTHER PUBLICATIONS

Wikipedia The Free Encyclopedia, "Tetrabutylammonium hydroxide" via https://web.archive.org/web/20160723105005/https://en.wikipedia.org/wiki/Tetrabutylammonium_hydroxide; pp. 1-2 (Year: 2016).*
Wikipedia The Free Encyclopedia, "Tetramethylammonium hydroxide" via https://web.archive.org/web/20161114133724/https://en.wikipedia.org/wiki/Tetramethylammonium_hydroxide; pp. 1-4 (Year: 2016).*

* cited by examiner

*Primary Examiner* — Binh X Tran
(74) *Attorney, Agent, or Firm* — WPAT, PC

(57) ABSTRACT

A silicon etchant with high $Si/SiO_2$ etching selectivity and its application are disclosed. The silicon etchant comprises at least one ketal and at least one quaternary ammonium hydroxide compound. The weight percentage of the ketal is 20~99 wt. % based on the total weight of the etchant and the weight percentage of the quaternary ammonium hydroxide compound is 0.1~10 wt. % based on the total weight of the etchant.

9 Claims, No Drawings

SILICON ETCHANT WITH HIGH SI/SIO2 ETCHING SELECTIVITY AND APPLICATION THEREOF

TECHNICAL FIELD OF THE INVENTION

The present invention relates to a silicon etchant with high $Si/SiO_2$ etching selectivity. In particular, the silicon etchant with high $Si/SiO_2$ etching selectivity comprises at least one ketal compound and at least one quaternary ammonium hydroxide compound. Furthermore, the silicon etchant with high $Si/SiO_2$ etching selectivity is used in nano-dimension silicon pattern etching process in semiconductor industries.

BACKGROUND OF THE INVENTION

In an advanced semiconductor fabrication, an etching process for making nano-dimension silicon pattern is critical. In the meanwhile, $SiO_2$ layer and dielectric layer have to be protected from damaging, so a special etchant is required for achieving the purpose.

However, current silicon etchants usually comprise polyols, and cause $SiO_2$ layer and dielectric layer corrosion in the etching process. As a result, a silicon etchant for effectively protecting $SiO_2$ layer and dielectric layer from corrosion in the etching process is required.

Based on the aforementioned, a novel silicon etchant for using in advanced semiconductor fabrication is emergent to be develop.

SUMMARY OF THE INVENTION

In one aspect, the present invention provides a silicon etchant. In particular, the silicon etchant is a silicon etchant with high $Si/SiO_2$ etching selectivity and can effectively protect $SiO_2$ layer and dielectric layer from corrosion in the etching process. The silicon etchant comprises at least one ketal compound and at least one quaternary ammonium hydroxide compound; and a weight percentage of the ketal compound is 20~99 wt. % based on total weight of the silicon etchant, and a weight percentage of the quaternary ammonium hydroxide compound is 0.1~10 wt. % based on total weight of the silicon etchant.

Preferably, the weight percentage of the ketal compound is 60~90 wt. % based on total weight of the silicon etchant.

In one representative embodiment, the ketal compound comprises a compound having a structure as shown in formula (1) or a cyclic ketal compound; where $R^1$, $R^2$, $R^3$ and $R^4$ are C1-C6 linear chain alkyl groups or C1-C6 branched chain alkyl groups.

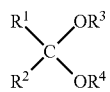

(1)

In another representative embodiment, the cyclic ketal compound comprises 2,2-Dimethyl-1,3-dioxolane-4-methanol, 2,2-dimethyl-1,3-dioxolane-4-ethanol, 4-Chloromethyl-2,2-dimethyl-1,3-dioxolane or 2,2-dimethyl-1,3-dioxolane-4-methylamine.

In still another representative embodiment, the quaternary ammonium hydroxide compound has a structure of $R^5R^6R^7R^8N^+OH^-$, where $R^5$, $R^6$, $R^7$ and $R^8$ are C1-C4 linear chain alkyl groups, C1-C4 branched chain alkyl groups, C1-C4 linear alcohol or C1-C4 branched alcohol.

In another aspect, the present invention provides a method for etching Si-pattern. The method comprises a step of applying the aforementioned silicon etchant in an etching process.

Typically, the etching process is an nano-Si pattern etching process for fabricating semiconductors.

In one representative embodiment, the aforementioned silicon etchant has $Si/SiO_2$ etching selectivity more than 500/1. Preferably, the aforementioned silicon etchant has $Si/SiO_2$ etching selectivity more than 1000/1.

In accordance with the present invention, the invented silicon etchant comprises 20~99 wt. % of the ketal compound and 0.1~10 wt. % of the quaternary ammonium hydroxide compound; and has $Si/SiO_2$ etching selectivity more than 500/1. Because the invented silicon etchant has a very high $Si/SiO_2$ etching selectivity, it is able to protect $SiO_2$ layer from corrosion in the etching process. Accordingly, the invented silicon etchant is very suitable for using in nano-Si pattern etching process for fabricating advanced semiconductors.

BRIEF DESCRIPTION OF THE PREFERRED EMBODIMENTS

In a first embodiment, the present invention discloses a silicon etchant with high $Si/SiO_2$ etching selectivity and can effectively protect $SiO_2$ layer and dielectric layer from corrosion in the etching process. The silicon etchant comprises at least one ketal compound and at least one quaternary ammonium hydroxide compound; and a weight percentage of the ketal compound is 20~99 wt. % based on total weight of the silicon etchant, and a weight percentage of the quaternary ammonium hydroxide compound is 0.1~10 wt. % based on total weight of the silicon etchant.

Preferably, the weight percentage of the ketal compound is 60~90 wt. % based on total weight of the silicon etchant.

In one representative example of the first embodiment, the ketal compound comprises a compound having a structure as shown in formula (1) or a cyclic ketal compound; where $R^1$, $R^2$, $R^3$ and $R^4$ are C1-C6 linear chain alkyl groups or C1-C6 branched chain alkyl groups.

(1)

In one representative example of the first embodiment, the cyclic ketal compound comprises 2,2-Dimethyl-1,3-dioxolane-4-methanol, 2,2-dimethyl-1,3-dioxolane-4-ethanol, 4-chloromethyl-2,2-dimethyl-1,3-dioxolane or 2,2-dimethyl-1,3-dioxolane-4-methylamine.

2,2-Dimethyl-1,3-dioxolane-4-methanol has a structure as shown in formula (2).

(2)

2,2-dimethyl-1,3-dioxolane-4-ethanol has a structure as shown in formula (3).

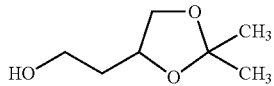
(3)

4-chloromethyl-2,2-dimethyl-1,3-dioxolane has a structure as shown in formula (4).

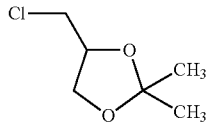
(4)

2,2-dimethyl-1,3-dioxolane-4-methylamine has a structure as shown in formula (5).

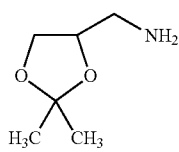
(5)

In one example of the first embodiment, the quaternary ammonium hydroxide compound has a structure of $R^5R^6R^7R^8N^+OH^-$, where $R^5$, $R^6$, $R^7$ and $R^8$ are C1-C4 linear chain alkyl groups, C1-C4 branched chain alkyl groups, C1-C4 linear alcohol or C1-C4 branched alcohol.

Representatively, the quaternary ammonium hydroxide compound comprises tetramethylammonium hydroxide (TMAH), tetraethylammonium hydroxide (TEAH), ethyltrimethylammonium hydroxide (ETMAH) or 2-hydroxyethyl trimethylammonium hydroxide.

In one example of the first embodiment, the silicon etchant further comprises a solvent. Preferably, the solvent is water.

In one example of the first embodiment, the silicon etchant is a silicon etchant with $Si/SiO_2$ etching selectivity more than 500/1.

In one example of the first embodiment, the silicon etchant is applied in an nano-Si pattern etching process.

In a second embodiment of the invention, the invention discloses a method for etching Si-pattern. The method comprises a step of applying the silicon etchant described in the first embodiment in an etching process.

Typically, the etching process is an nano-Si pattern etching process for fabricating semiconductors.

In one representative example of the second embodiment, the aforementioned silicon etchant has $Si/SiO_2$ etching selectivity more than 500/1. Preferably, the aforementioned silicon etchant has $Si/SiO_2$ etching selectivity more than 1000/1.

Measurement of Etching Rate of the Silicon Etchant and $Si/SiO_2$ Etching Selectivity The measurement of etching rate of the silicone etchant is performed at 60□. Testing specimen is a wafer surface coating an amorphous silicon film and a wafer surface coating a $SiO_2$ film, respectively. The amorphous silicon film has a thickness of 2000 Å (Angstrom), and the $SiO_2$ film has a thickness of 50 Å (Angstrom). Measure the thickness of the amorphous silicon film and $SiO_2$ film before etching process by Ellipsometer and obtain initial thickness value X Å, respectively. Then, completely immerse the testing specimen into the silicone etchant at 60□. After 60 minutes, remove the testing specimen from the silicone etchant and wash the testing specimen with pure water until no residual silicone etchant on the surface. Measure the thickness of the amorphous silicon film and $SiO_2$ film again and obtain a thickness value Y Å. The etching rate of the silicone etchant is calculated by the following equation.

The etching rate(Å/min)=$(X\ Å - Y\ Å)/(Time(min))$

According to the aforementioned measurement and equation, the etching rate of amorphous silicon (Si) and $SiO_2$ are obtained. $Si/SiO_2$ etching selectivity of the silicon etchant is calculated by the etching rate of amorphous silicon (Si) divided by the etching rate of $SiO_2$.

Eleven silicon etchants are evaluated their performance. The composition of the silicon etchants, the etching rate of amorphous silicon (Si), the etching rate of $SiO_2$ and $Si/SiO_2$ etching selectivity are list in TABLE 1.

TABLE 1

| Example | quaternary ammonium hydroxide | AMINE | POLYOL | 2,2-Dimethyl-1,3-dioxolane-4-methanol | Etching rate of Si (Å/min) | Etching rate of $SiO_2$ (Å/min) | $Si/SiO_2$ etching selectivity |
|---|---|---|---|---|---|---|---|
| 1 | TMAH 1.5% | | | 60% | 320 | 0.31 | 1032 |
| 2 | TMAH 1.5% | | | 70% | 300 | 0.21 | 1428 |
| 3 | ETMAH 1.8% | | | 70% | 280 | 0.20 | 1400 |
| 4 | ETMAH 2.5% | | | 80% | 350 | 0.18 | 1944 |
| 5 | TMAH 2.0% | | | 50% | 545 | 0.83 | 657 |
| 6 | TMAH 1.5% | | EG 50% | 20% | 310 | 0.61 | 508 |
| 7 | TMAH 1.5% | | | | 1000 | 5 | 200 |
| 8 | TMAH 1.5% | MEA 70% | | | 360 | 0.75 | 480 |
| 9 | TMAH 1.5% | | EG 70% | | 250 | 0.74 | 338 |
| 10 | ETMAH 1.8% | MEA 50% | EG 20% | | 320 | 0.75 | 427 |
| 11 | ETMAH 1.0% | | | 15% | 580 | 2.7 | 215 |

1. MEA: Monoethanolamine
2. EG: Ethylene glycol

Examples 1~6 are invented silicon etchants. Obviously, all of them have a Si/SiO$_2$ etching selectivity more than 500. In particular, when the invented silicon etchants contain more than 60 weight % of 2,2-Dimethyl-1,3-dioxolane-4-methanol, the Si/SiO$_2$ etching selectivity is more than 1000. On the contrary, examples 7~10 are traditional silicon etchants. Example 11 is a silicon etchant contain only 15 weight % of 2,2-Dimethyl-1,3-dioxolane-4-methanol. Examples 7~11 have Si/SiO$_2$ etching selectivity less than 500. Accordingly, the invented silicon etchant that comprises 20~99 wt. % of the ketal compound and 0.1~10 wt. % of the quaternary ammonium hydroxide compound has an unexpected performance of enhancing Si/SiO$_2$ etching selectivity when compared to traditional silicon etchants.

While the invention has explained in relation to its preferred embodiments and working examples, it is well understand that various modifications thereof will become apparent to those skilled in the art upon reading the specification. Therefore, the invention disclosed herein intended to cover such modifications as fall within the scope of the appended claims.

What is claimed is:

1. A silicon etchant, comprising, at least one ketal compound, wherein the ketal compound comprises 2,2-Dimethyl-1,3-dioxolane-4-methanol, 2,2-dimethyl-1,3-dioxolane-4-ethanol, 4-Chloromethyl-2,2-dimethyl-1,3-dioxolane or 2,2-dimethyl-1,3-dioxolane-4-methylamine; and at least one quaternary ammonium hydroxide compound; and a weight percentage of the ketal compound is 20 to 99 wt. % based on total weight of the silicon etchant, and a weight percentage of the quaternary ammonium hydroxide compound is 0.1 to 10 wt. % based on total weight of the silicon etchant.

2. The silicon etchant of claim 1, wherein the weight percentage of the ketal compound is 60 to 90 wt. % based on total weight of the silicon etchant.

3. The silicon etchant of claim 1, wherein the quaternary ammonium hydroxide compound has a structure of $R^5R^6R^7R^8N^+OH^-$, where $R^5$, $R^6$, $R^7$ and $R^8$ are C1-C4 linear chain alkyl groups, C1-C4 branched chain alkyl groups, C1-C4 linear alcohol or C1-C4 branched alcohol.

4. The silicon etchant of claim 1, wherein the quaternary ammonium hydroxide compound comprises tetramethylammonium hydroxide, tetraethylammonium hydroxide, ethyltrimethylammonium hydroxide or 2-hydroxyethyl trimethylammonium hydroxide.

5. The silicon etchant of claim 1, being a silicon etchant with Si/SiO$_2$ etching selectivity more than 500/1.

6. The silicon etchant of claim 1, further comprises a solvent.

7. The silicon etchant of claim 6, wherein the solvent is water.

8. A method for etching Si-pattern, comprising, applying the silicon etchant of claim 1 in an etching process.

9. The method for etching Si-pattern of claim 8, wherein the etching process is an nano-Si pattern etching process for fabricating semiconductors.

* * * * *